| (12) | United States Patent | (10) Patent No.: | US 10,484,586 B1 |
|---|---|---|---|
| | Chen et al. | (45) Date of Patent: | Nov. 19, 2019 |

(54) CAMERA MODULE AND LENS HOLDER OF THE CAMERA MODULE

(71) Applicant: TRIPLE WIN TECHNOLOGY(SHENZHEN) CO.LTD., Shenzhen (CN)

(72) Inventors: Shin-Wen Chen, New Taipei (TW); Kun Li, Shenzhen (CN); Ke-Hua Fan, Shenzhen (CN); Long-Fei Zhang, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/236,549

(22) Filed: Dec. 30, 2018

(30) Foreign Application Priority Data

Nov. 8, 2018 (CN) .......................... 2018 1 1327695

(51) Int. Cl.
| H04N 5/225 | (2006.01) |
| H04N 5/232 | (2006.01) |
| H01L 27/146 | (2006.01) |
| G03B 13/36 | (2006.01) |
| G02B 27/64 | (2006.01) |

(52) U.S. Cl.
CPC ......... *H04N 5/2254* (2013.01); *H04N 5/2253* (2013.01); *H01L 27/14618* (2013.01)

(58) Field of Classification Search
CPC .. H04N 5/2254; H04N 5/2253; H04N 5/2257; H04N 5/2328; G03B 13/36; G02B 27/646; H01L 27/14618

USPC ......... 348/335, 294, 374–376; 257/432, 464, 257/508, 635, 27, 63, 334; 250/208.1; 359/829, 808, 823, 824; 396/133, 12, 396/529, 91; 428/141

See application file for complete search history.

(56) References Cited

U.S. PATENT DOCUMENTS

| 8,514,327 | B2 * | 8/2013 | Ku | H04N 5/225 |
|---|---|---|---|---|
| | | | | 348/374 |
| 9,980,372 | B2 * | 5/2018 | Ohara | H05K 1/0274 |
| | | | | 348/335 |
| 2005/0116138 | A1 * | 6/2005 | Hanada | H01L 27/14618 |
| | | | | 438/406 |
| 2008/0122967 | A1 * | 5/2008 | Huang | H04N 5/225 |
| | | | | 348/340 |
| 2011/0194023 | A1 * | 8/2011 | Tam | G03B 17/02 |
| | | | | 396/529 |
| 2012/0229924 | A1 * | 9/2012 | Hou | G02B 7/02 |
| | | | | 359/820 |

(Continued)

*Primary Examiner* — Marly S Camargo

(74) *Attorney, Agent, or Firm* — ScienBiziP, P.C.

(57) ABSTRACT

A lens holder able to equalize air pressure at all times with the ambient atmosphere includes a packaging member and a support member. The packaging member has upper and lower surfaces, and the packaging member includes a first through hole and a groove in communication with the first through hole. The support member has first and second surfaces and includes a second through hole and a vent hole in communication with the second through hole. The packaging member is mounted to the second surface of the support member, the first through hole is in communication with the second through hole, and the vent hole of the support member is in communication with the groove of the packaging member. A camera module including the lens holder is also provided.

18 Claims, 4 Drawing Sheets

(56) References Cited

U.S. PATENT DOCUMENTS

| | | | | |
|---|---|---|---|---|
| 2014/0049671 A1* | 2/2014 | Chen | ................... | H01L 31/0232 |
| | | | | 348/294 |
| 2014/0049686 A1* | 2/2014 | Chen | .................... | H01L 27/146 |
| | | | | 348/340 |
| 2015/0103195 A1* | 4/2015 | Kwon | ................ | H04N 5/23228 |
| | | | | 348/340 |
| 2017/0310861 A1* | 10/2017 | Wang | ................... | H04N 5/2254 |
| | | | | 348/374 |

* cited by examiner

CAMERA MODULE AND LENS HOLDER OF THE CAMERA MODULE

FIELD

The disclosure generally relates to cameras.

BACKGROUND

In assembling a camera module of an electronic device such as a mobile phone, an adhesive is dispensed on a lens holder of the camera module and a filter is attached to the lens holder. The lens holder is assembled on a circuit board and then baked. Finally, a lens is assembled to the lens holder. In the camera module, a closed receiving chamber is formed by the lens holder, the circuit board, and the filter, therefore, a vent hole is needed to exhaust gas pressure in the receiving chamber. However, the vent hole can be easily blocked by the adhesive, thus the gas may expand during baking and deform the lens holder.

BRIEF DESCRIPTION OF THE DRAWINGS

Implementations of the present technology will now be described, by way of embodiments, with reference to the attached figures.

DETAILED DESCRIPTION

Figure 1:
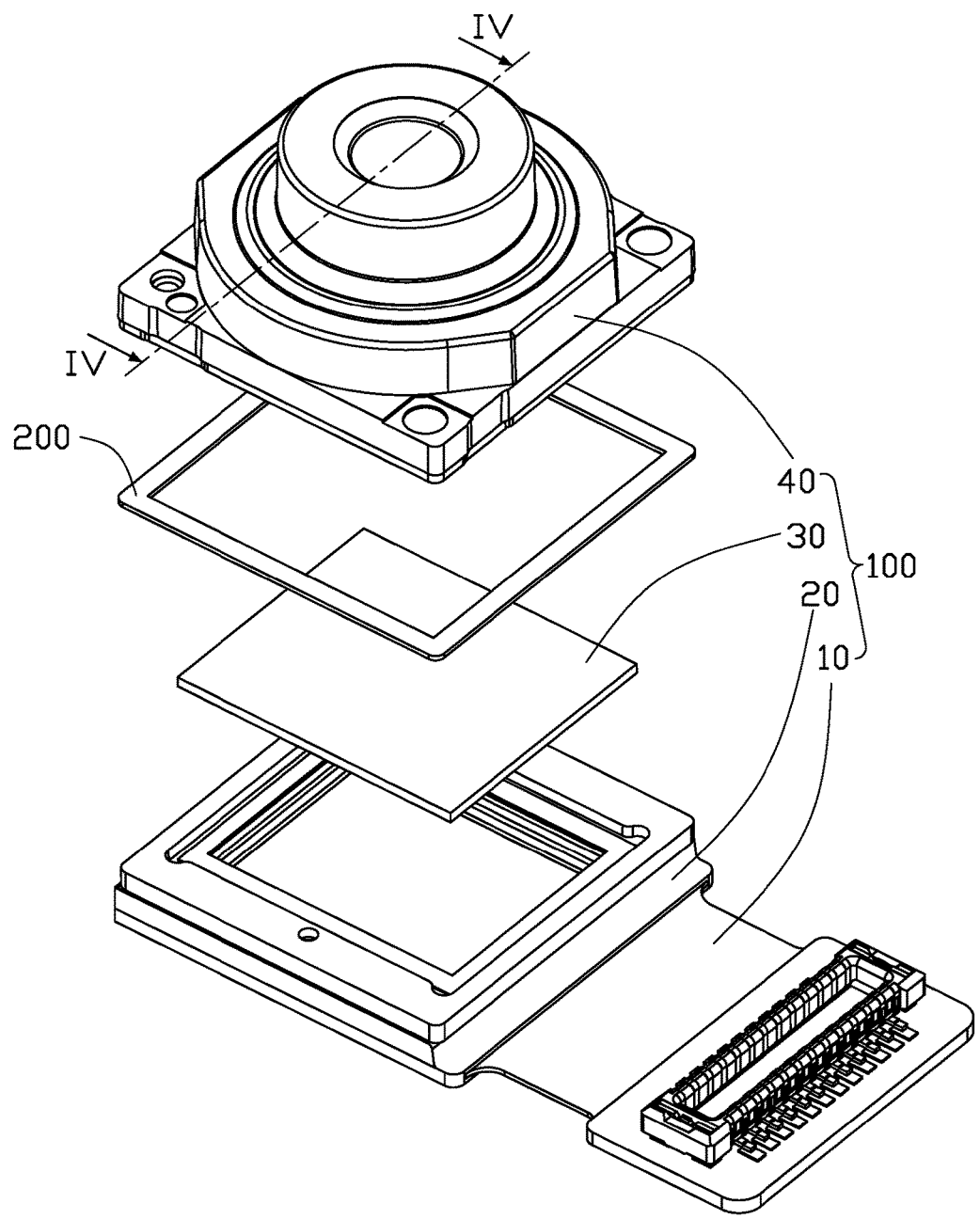
FIG. 1 is an isometric view illustrating an embodiment of a camera module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to", it specifically indicates open-ended inclusion or membership in a so-described combination, group, series, and the like.

FIG. 1 illustrates a camera module 100 of an embodiment of this disclosure. The camera module 100 may include a photosensitive assembly 10, a lens holder 20, a filter 30, and a lens 40. The camera module 100 may further include an ultraviolet (UV) light-curable adhesive (adhesive 200) for fixing the lens 40 and the lens holder 20, and fixing the filter 30 and the lens holder 20.

Figure 2:
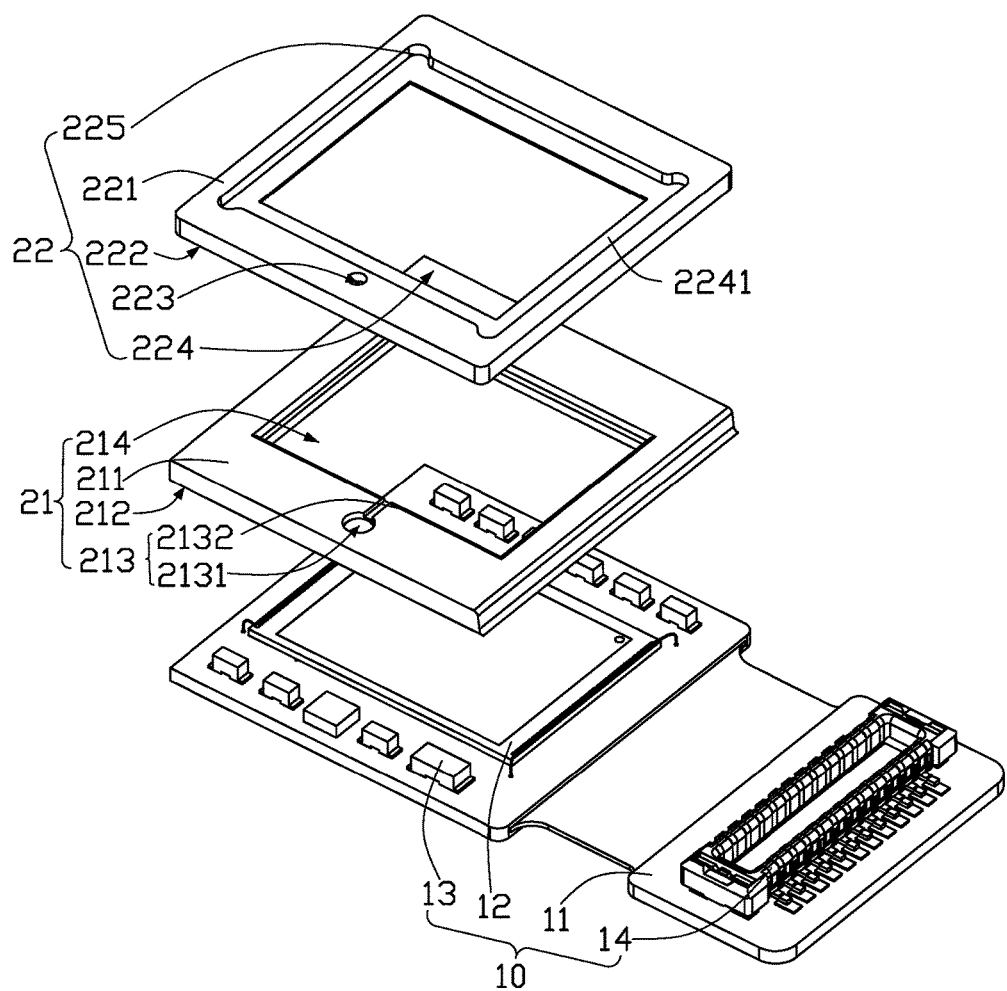
FIG. 2 is an exploded isometric view of the camera module of FIG. 1.

FIG. 2 illustrates that the photosensitive assembly 10 may include a circuit board 11, a photosensitive chip 12, a plurality of electronic components 13, and a connector 14.

The photosensitive chip 12, the electronic members 13, and the connector 14 may be mounted on the circuit board 11. The electronic components 13 may be arranged at opposing sides of the photosensitive chip 12, and the electronic components 13 may include a resistor, a capacitor, a driver, or other electronic components.

In at least one embodiment, a number of the electronic components 13 may be ten and they are arranged at two sides of the photosensitive chip 12.

The lens holder 20 may include a packaging member 21 and a support member 22. The photosensitive assembly 10 is fixed to one side of the packaging member 21 away from the support member 22.

Figure 3:
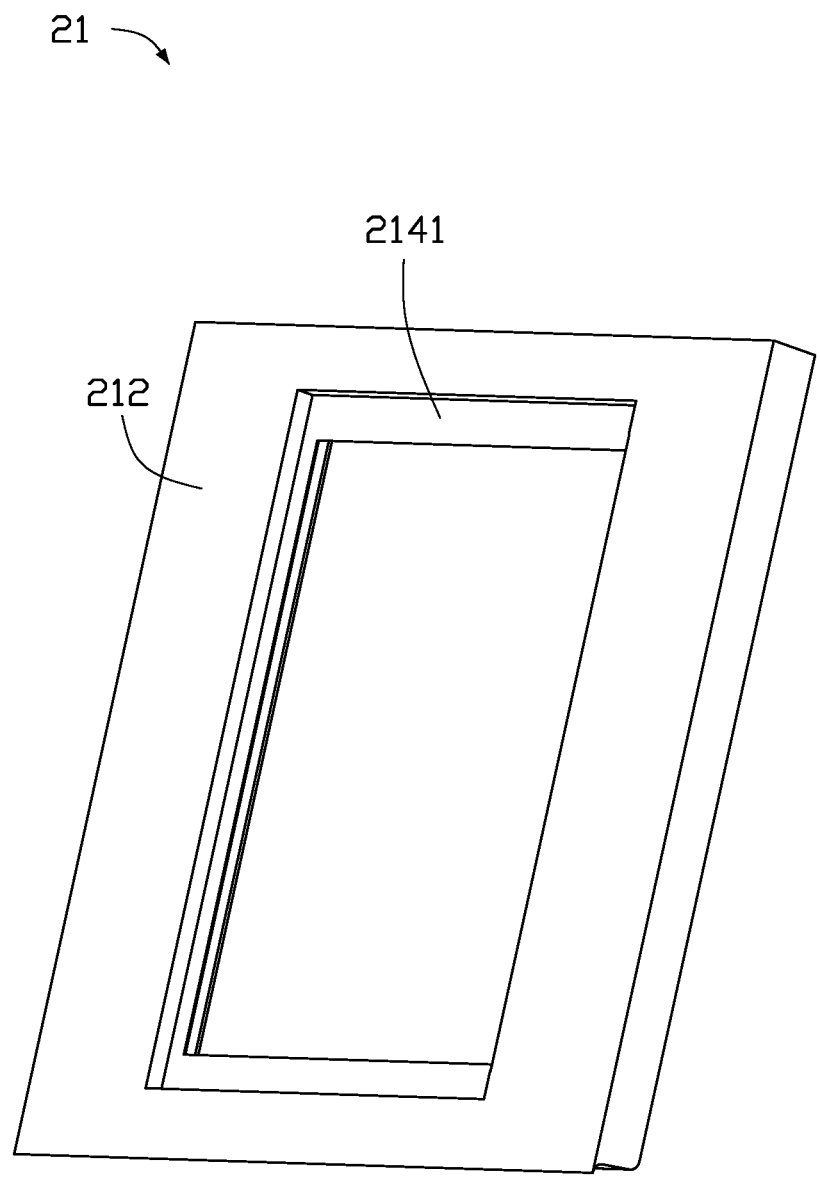
FIG. 3 is a packaging member of the camera module of FIG. 2.

The packaging member 21 may include an upper surface 211 facing the support member 22 and a lower surface 212 opposite to the upper surface 211. A central portion of the packaging member 21 may include a first through hole 214 running through the upper surface 211 and the lower surface 212, and the upper surface 211 of the packaging member 21 may include a groove 213. The groove 213 may include a main portion 2131 and an extending portion 2132. The main portion 2131 is in communication with the vent hole, and the extending portion 2132 extends from the main portion to the first through hole 214. The main portion 2131 may be, but is not limited to being, circular. FIG. 3 shows that the packaging member 21 further includes a first stepped groove 2141 extending from an inner wall of the first through hole 214, and the first stepped groove 2141 is arranged at one side of the first through hole 214 away from the support member 22. The photosensitive chip 12 is mounted in the first stepped groove 2141 of the packaging member 21.

The support member 22 may include a first surface 221 and a second surface 222 opposite to the first surface 221. The support member 22 may include a second through hole 224 running through the first surface 221 and the second surface 222. The support member 22 includes a second stepped groove 2241 extending from an inner wall of the second through hole 224. The second stepped groove 2241 is arranged at one side of the second through hole 224 adjacent to the first surface 221. The support member 22 may define a vent hole 223 on one side of the second through hole 224.

In at least one embodiment, the packaging member 21 and the support member 22 may be a substantially rectangular frame. In other embodiments, the packaging member 21 and the support member 22 may be circular, elliptical, square, or other shapes.

In at least one embodiment, the packaging member 21 is encapsulated on the circuit board 13 of the photosensitive assembly 10 by injection molding or molding process and covers the electronic components 13 and a portion of the photosensitive chip 12. The portion of the photosensitive chip 12 covered by the packaging member 21 is a non-photosensitive area. A photosensitive area of the photosensitive chip 12 is located on the first stepped groove 2141 of the package 21.

The upper surface 211 of the package member 21 and the second surface 222 of the support member 22 are fixedly connected by the adhesive 200. The filter 30 is attached to the second stepped groove 2241 of the support member 22 by the adhesive 200.

To achieve a better fit, a plurality of overflow tanks 225 are formed outwardly along a side wall of the second stepped groove 2241 of the support member 22. In at least one embodiment, a number of the overflow tanks 225 is four, and the four overflow tanks 225 are arranged at four corners of the second stepped groove 2241.

The first through hole 214 of the packing member 21 is in communication with the second through hole 224 of the support member 22, and the first through hole 214 and the second through hole 224 form a light path to the photosensitive chip 12. The vent hole 223 of the support member 22 is in communication with the groove 213 of the packaging member 21.

The groove 213 is defined on the first surface 221 of the packaging member 21, the main portion 2131 of the groove 213 is arranged under the vent hole 223, and the extending portion 2132 is in communication with the first through hole 214. In other embodiments, the groove 213 may be arranged inside of the packaging member 21.

Figure 4:
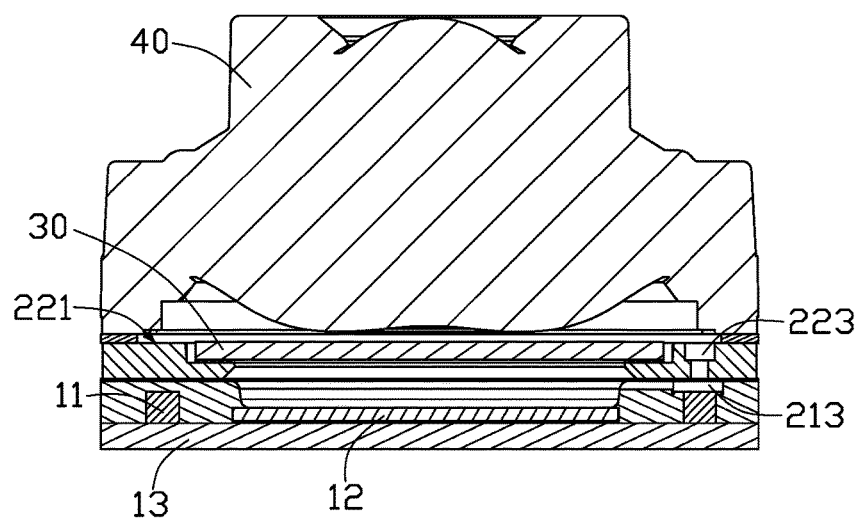
FIG. 4 is a cross-sectional view along line VI-VI of FIG. 1.

FIG. 4 shows that the vent hole 223 is stepped. A diameter of one end of the vent hole 223 is larger than the other. The end adjacent to the first surface 221 of the support member 22 is larger than a diameter of the other end. In at least one embodiment, one end of the vent hole 223 is in communication with the groove 213, and the other end of the vent hole 223 runs through the first surface 221 of the support member 22. In other embodiments, one end of the vent hole 223 is in communication with the groove 213, and the other end of the vent hole 223 may run through the sidewall of the second stepped groove 2241 or the overflow tank 225.

In at least one embodiment, the groove 213 is provided with a dustproof glue.

The lens 40 is located above the first surface 221 of the support member 22 and connected to an edge of the first surface 221. The vent hole 223 is defined between the second stepped groove 2241 and a portion of lens 40 connected to the support member 22.

The camera module 100 includes the photosensitive assembly 10, the lens holder 20, the filter 30, and the lens 40. The vent hole 223 of the support member 22 is in communication with the groove 213 of the upper surface 211 of the packaging member 21. When baking the UV adhesive 200, the air in the camera module 100 may expand. As the air is able to exit from the groove 213 and the vent hole 223, the lens holder 20 will not be deformed. Even if a camera of a mobile phone is shaken, particles will not be able to drop onto the photosensitive chip 12 through the vent hole 223.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A lens holder, comprising:
   a packaging member comprising an upper surface and a lower surface opposite to the upper surface, the packaging member comprising a first through hole running through the upper surface and the lower surface, and a groove in communication with the first through hole;
   a support member comprising a first surface and a second surface opposite to the first surface, the support member comprising a second through hole running through the first surface and the second surface, and a vent hole in communication with the second through hole;
   wherein the packaging member is mounted to the second surface of the support member, the first through hole is in communication with the second through hole, and the vent hole of the support member is in communication with the groove of the packaging member.

2. The lens holder of claim 1, wherein the packaging member further comprises a first stepped groove extending from an inner wall of the first through hole, and the first stepped groove is arranged at one side of the first through hole away from the support member.

3. The lens holder of claim 1, wherein the support member further comprises a second stepped groove extending from an inner wall of the second through hole, and the second stepped groove is arranged at one side of the second through hole adjacent to the first surface.

4. The lens holder of claim 3, wherein a plurality of overflow tanks are formed outwardly along a side wall of the second stepped groove of the support member.

5. The lens holder of claim 4, wherein one end of the vent hole is in communication with the groove, and another end of the vent hole runs through the first surface of the support member.

6. The lens holder of claim 4, wherein one end of the vent hole is in communication with the groove, and another end of the vent hole runs through a sidewall of the second stepped groove or the overflow tank.

7. The lens holder of claim 1, wherein the groove is arranged at the upper surface of the packaging member, the groove comprises a main portion and an extending portion, the main portion is in communication with the vent hole, and the extending portion extends from the main portion to the first through hole.

8. The lens holder of claim 1, wherein the vent hole is stepped, a diameter of one end of the vent hole adjacent to the first surface of the support member is larger than a diameter of another end of the vent hole.

9. A camera module, comprising:
   a lens holder comprising:
      a packaging member comprising an upper surface and a lower surface opposite to the upper surface, the packaging member comprising a first through hole running through the upper surface and the lower surface, and a groove in communication with the first through hole;
      a support member comprising a first surface and a second surface opposite to the first surface, the support member comprising a second through hole running through the first surface and the second surface, and a vent hole in communication with the second through hole;
   a photosensitive assembly mounted to one side of the packaging member away from the support member;
   a filter mounted to the support member, and
   a lens mounted to the first surface of the support member;
   wherein the packaging member is mounted to the second surface of the support member, the first through hole is in communication with the second through hole, and the vent hole of the support member is in communication with the groove of the packaging member.

10. The camera module of claim 9, wherein the packaging member further comprises a first stepped groove extending from an inner wall of the first through hole, and the first stepped groove is arranged at one side of the first through hole away from the support member.

11. The camera module of claim 9,
   wherein the support member further comprises a second stepped groove extending from an inner wall of the second through hole, and the second stepped groove is arranged at one side of the second through hole adjacent to the first surface; and
   wherein the filter is mounted on the second stepped hole of the support member.

12. The camera module of claim 11, wherein a plurality of overflow tanks are formed outwardly along a side wall of the second stepped groove of the support member.

13. The camera module of claim 12, wherein one end of the vent hole is in communication with the groove, and another end of the vent hole runs through the first surface of the support member.

14. The camera module of claim 12, wherein one end of the vent hole is in communication with the groove, and another end of the vent hole runs through a sidewall of the second stepped groove or the overflow tank.

15. The camera module of claim 9, wherein the groove is arranged at the upper surface of the packaging member, the groove comprises a main portion and an extending portion, the main portion is in communication with the vent hole, and the extending portion extends from the main portion to the first through hole.

16. The camera module of claim 9, wherein the vent hole is stepped, a diameter of one end of the vent hole adjacent to the first surface of the support member is larger than a diameter of another end of the vent hole.

17. The camera module of claim 9, wherein the photosensitive assembly comprises a circuit board, and a photosensitive chip, a plurality of electronic components, and a connector mounted on the circuit board, the packaging member is encapsulated on the circuit board of the photosensitive assembly by injection molding or molding process, and the packaging member covers the electronic components and a portion of the photosensitive chip.

18. The camera module of claim 17, wherein the vent hole is defined between the second stepped groove and a portion of lens connected to the support member.

* * * * *